United States Patent [19]

Fujisawa

[11] Patent Number: 4,908,620
[45] Date of Patent: Mar. 13, 1990

[54] ANALOG-TO-DIGITAL AND DIGITAL-TO-ANALOG CONVERTER

[75] Inventor: Akihiko Fujisawa, Tokyo, Japan

[73] Assignee: Oki Electric Industry Co., Ltd., Tokyo, Japan

[21] Appl. No.: 305,383

[22] Filed: Feb. 1, 1989

[30] Foreign Application Priority Data

Feb. 9, 1988 [JP] Japan ................. 63-28472

[51] Int. Cl.[4] ................................ H03M 1/02
[52] U.S. Cl. ...................... 341/108; 341/150; 341/172
[58] Field of Search ............... 341/108, 122, 126, 138, 341/144, 150, 158, 165, 172; 375/25, 26, 27, 28

[56] References Cited

U.S. PATENT DOCUMENTS

| | | | |
|---|---|---|---|
| 4,348,768 | 7/1982 | Svala | 341/108 X |
| 4,350,975 | 9/1982 | Haque et al. | 341/108 |
| 4,380,756 | 4/1983 | Worsman | 341/108 |
| 4,385,286 | 5/1983 | Haque | 341/108 |
| 4,404,544 | 9/1983 | Dwarakanath | 341/108 |
| 4,622,536 | 11/1986 | Shih et al. | 341/172 X |

Primary Examiner—William M. Shoop, Jr.
Assistant Examiner—B. K. Young
Attorney, Agent, or Firm—Edward D. Manzo

[57] ABSTRACT

An analog-to-digital and digital-to-analog converter includes an array of capacitors each being differently weighed from the others, one electrode of each of the capacitors being connected to a common node. Switches are provided for selectively applying, in response to a first control signal, an analog input applied to an analog input terminal and a plurality of reference voltages to the other electrode of the capacitors. A comparator has a pair of input terminals whose inverting and non-inverting inputs are selectively switched over with respect to polarity in response to a second control signal. The comparator compares a voltage appearing on the node and applied to one of the input terminals and one of the reference voltages applied to the other input terminal. An analog output terminal is connected to the output of the comparator. A successive comparison register sequentially takes in outputs of the comparator in response to a third control signal. A latch selectively takes in and temporarily holds one of digital inputs applied via a digital input terminal and outputs of the successive comparison register in response to the second control signal. A digital output terminal is connected to the output of the latch. The first and third control signals are generated by a timing generating circuit in response to an output of the latch.

7 Claims, 9 Drawing Sheets

| FIG.5A | FIG.5B |

ANALOG-TO-DIGITAL AND DIGITAL-TO-ANALOG CONVERTER

BACKGROUND OF THE INVENTION

1. Field of the Invention

The present invention generally relates to a monolithic integrated circuit and, more particularly, to an analog-to-digital (AD) and digital-to-analog (DA) converter having a capability of transforming a digital signal into an analog signal in addition to a capability of converting an analog signal into a digital signal.

2. Description of the Prior Art

In the monolithic integrated circuit art, it has been customary to implement an AD converter and a DA converter as independent circuits. Various efforts have heretofore been made to promote integrated circuit configuration of an AD converter and a DA converter. Concerning an AD converter, for example, charge comparison type AD converters adopting a successive comparison principle are disclosed in "Introduction to AD Converter" by Yoneyama, 1st edition (Sept. 25, 1983), Ohm-Sha Ltd., pp. 99–109 and Japanese Patent Laid-Open Publication No. 30815/1986 by way of example.

The charge comparison type AD converter shown and described in JP Patent Laid-Open Publication No. 30815/1986 includes an array of weighted capacitors and an array of switches which are individually connected to the capacitors. While the switch array is operated, a comparator compares the varying voltage of the capacitor array with an analog input and the results of comparison are loaded in a successive comparison register. The register therefore establishes a switch connection condition of the switch array which is analogous to the analog input, outputs of the register being fed out in the form of a digital signal via a latch. This kind of AD converter is successful in reducing the geometrical area of the capacitor array and thereby the overall area required of a chip.

However, a prior art AD converter having the above configuration cannot play the role of a DA converter. More specifically, when DA conversion is needed, an independent DA converter has to be provided on the same IC substrate as the AD converter. This increases the overall dimensions of an IC chip and is therefore contradictory to the increasing demand for high integration.

SUMMARY OF THE INVENTION

It is therefore an object of the present invention to provide an AD and DA converter which implements both of an AD conversion capability and a DA conversion capability with a minimum chip size.

In accordance with the present invention, an AD and DA converter includes a capacitor array comprising a plurality of capacitors each being differently weighted from the others, one elecrode of each of the capacitors being connected to a common node. Switches are provided for selectively applying, in response to a first control signal, an analog input applied to an analog input terminal and a plurality of reference voltages to the other electrode of the capacitors. A comparator has a pair of input terminals an inverting and a non-inverting input of which are selectively switched over with respect to polarity in response to a second control signal. The comparator compares a voltage appearing on the node and applied to one of the input terminals and one of the reference voltages applied to the other input terminal. An analog output terminal is connected to the output of the comparator. A successive comparison register sequentially takes in outputs of the comparator in response to a third control signal. A latch selectively takes in and temporarily holds one of digital inputs applied via a digital input terminal and outputs of the successive comparison register in response to the second control signal. A digital output terminal is connected to the output of the latch. The first and third control signals are generated by a timing generating circuit in response to an output of the latch.

Further, in accordance with the present invention, an AD and DA converter includes an analog input terminal for receiving an analog input, a digital input terminal for receiving digital inputs, a plurality of capacitors each being differently weighted in capacitance from the others by a power of 2, and a reference voltage source for generating a plurality of reference voltages. First switches selectively connect either one of the analog input terminal and the plurality of reference voltages to one electrode of the capacitors in response to a first control signal. A comparator has a pair of input terminals which are selectively operative as an inverting and a non-inverting input selectively switchable over with respect to polarity in response to a second control signal which selectively commands a first and a second operation mode, one of the pair of input terminals being connected to another electrode of the capacitors. The comparator compares voltages which appear on the pair of input terminals. In response to the first control signal, second switches selectively connect either one of the reference voltages to the other of the pair of input terminals and configure the comparator into a voltage follower type amplifier for impedance conversion. An analog output terminal is connected to an output of the comparator. A successive comparison register sequentially takes in outputs of the comparator in response to a third control signal. A latch selectively takes in and temporarily holds either one of digital inputs from the digital input terminal and outputs of the successive comparison register in response to the second control signal. A digital output terminal is connected to an output of the latch. The first and third control signals are generated by a timing generating circuit in response to an output of the latch. In response to the second control signal, the compatator in the first operation mode produces an output associated with a difference between voltages appearing on the pair of input terminals, and in the second operation mode performs the impedance conversion between the pair of input terminals by selecting polarity opposite to polarity assigned to the first operation mode. In response to the second control signal, the latch takes in outputs of the successive comparison register in the first operation mode and digital inputs from the digital input terminal in the second mode.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

Figure 1A:
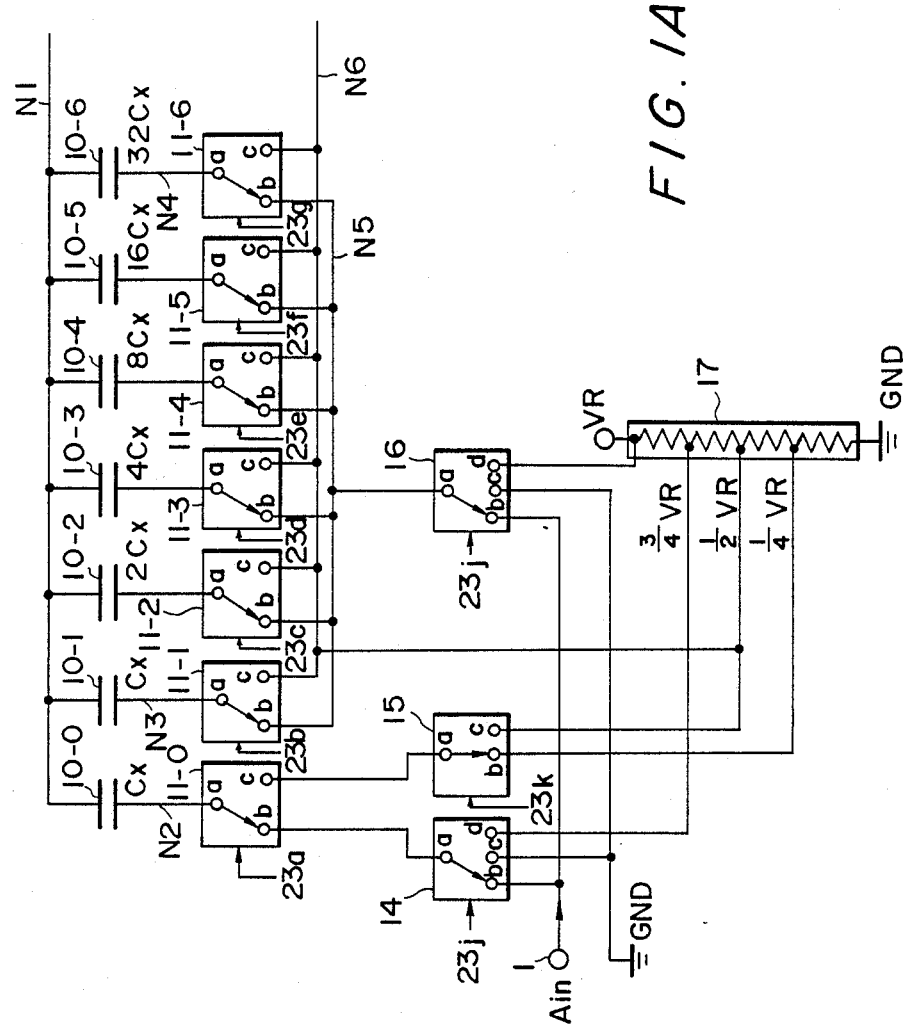
FIGS. 1A and 1B are schematic block diagrams showing an AD and DA converter embodying the present invention.
Figure 1B:
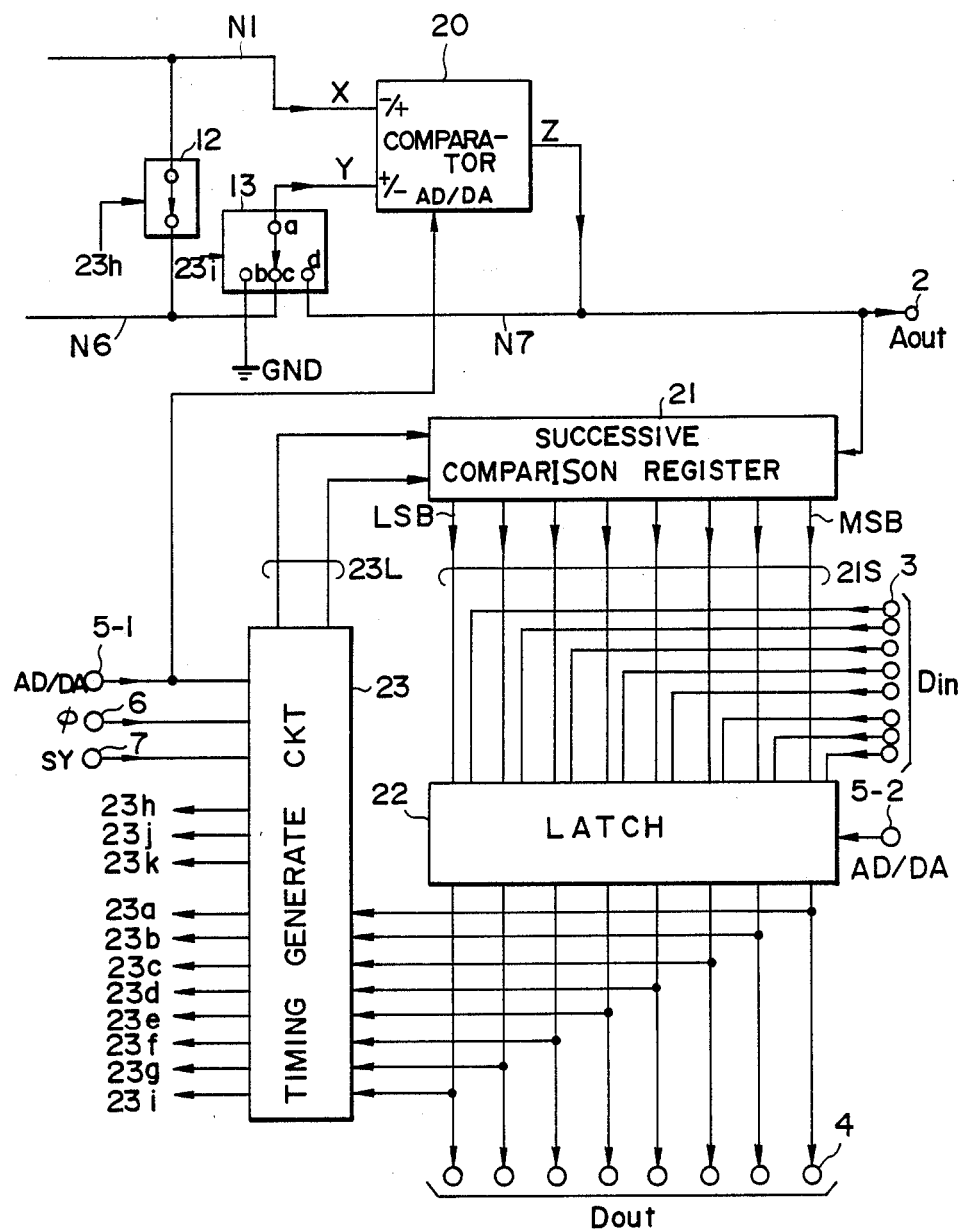

Referring to FIGS. 1A and 1B, there is shown a combined eight-bit AD and DA converter on AD-DA converter embodying the present invention which operates on a single power supply. The AD-DA converter has an input terminal 1, an output terminal 2, an input terminal 3 and an output terminal 4 which are assigned to an analog input Ain, an analog output Aout, digital inputs Din and digital outputs Dout. Terminals 5-1 and 5-2 are provided for receiving an external switching signal AD/DA which selects an AD mode operation or a DA mode operation. Terminals 6 and 7 respectively receive a clock signal $\phi$ and a synchronizing signal SY. A plurality of weighted capacitors 10-0 to 10-6 are commonly connected at their one plate to a common node N1, constituting a capacitance array. A plurality of switchs 11-0 to 11-6 are arranged in an array and individually connected to the other plate of the capacitors 10-0 to 10-6. In the capacitor array, both of the capacitors 10-0 and 10-1 have a capacitance Cx, e. g. 1.5 picofarads. The capacitances of the other capacitors 10-2, 10-3, 10-4, 10-5 and 10-6 are weighted by 2Cx, 4Cx, 8Cx, 16Cx and 32Cx, respectively. The switches 11-0 to 11-6 have a movable terminal or arm a and a pair of stationary terminals b and c. Switching signals 23a to 23g actuate respectively the switches 11-0 to 11-6. The movable arms a of the switches 11-0 to 11-6 are individually connected to the other plates of the capacitors 10-0 to 10-6. The stationary terminals b of the switches 11-1 to 11-6 are commonly connected to a node N5 while the stationary terminals c of the same are commonly connected to a node N6. In FIG. 1A, the movable arms a of the switches 11-0, 11-1 and 11-6 are respectively connected to the nodes N2, N3 and N4. It should be understood that the above-mentioned switches as well as the other switches can be implemented by a MOS switch although they are shown and described as if they were mechanical switches having a movable arm and stationary terminals to facilitate an understanding the construction and operation.

A switch 12 is connected between the nodes N1 and N6 and turned on and off by a switching signal 23h. Switches 13, 14 and 16 have a movable arm a and stationary terminals b, c and d and are operated by switching signals 23i, 23j and 23j, respectively. A switch 15 has a movable arm a and stationary terminals b and c and is actuated by a switching signal 23k. A reference voltage generating circuit 17, a voltage dividing resistor, produces three different voltages $\frac{3}{4}$·VR, $\frac{1}{2}$·VR and $\frac{1}{4}$·VR by dividing a reference voltage. The switch 13 has the stationary terminals b, c and d connected to ground GND, the node N6, and a node N7, respectively. The switches 14, 15 and 16 have the movable arms a connected respectively to the stationary terminal b of the switch 11-0, the stationary terminal c of the switch 110, and the node N5. The switch 14 has the stationary terminals b, c and d connected to the input terminal 1, ground GND, and voltage $\frac{3}{4}$·VR, respectively. The switch 15 has the stationary terminals b and c connected to the voltages $\frac{1}{4}$·VR and $\frac{1}{2}$·VR, respectively. Further, the switch 16 has the stationary terminals b, c and d connected to the input terminal 1, ground GND, and reference voltage VR, respectively. The voltage $\frac{1}{2}$·VR is further connected to the node N6.

A comparator 20 has an input terminal X connected to the node N1 and an input terminal Y connected to the movable arm a of the switch 13. The comparator 20 also has an output terminal Z connected to the node N7 and output terminal 2 and an AD/DA terminal connected to the terminal 5-1. The switching signal AD/DA is fed to the AD/DA terminal of the comparator 20 to operate the latter. Specifically, when the signal AD/DA is in a (logical) ONE, the comparator 20 is conditioned for an AD operation mode with the input terminals X and Y serving as an inverting input terminal and a noninverting input terminal, respectively. Conversely, when the signal AD/DA is in a (logical) ZERO, the comparator 20 is operated in a DA operation mode with the input terminals X and Y replacing each other with respect to polarity.

The output terminal 2 is connected to the input of a successive comparison register 21 having multiple stages. The output of the individual stages of the successive comparison register 21 is connected to the input side of individual stages of a latch 22 which is provided with a selector, together with the input terminal 3. The output side of individual stages of the latch 22 is connected to the output terminal 4 and the input of a timing generating circuit 23. A control signal 23L is fed from the timing generating circuit 23 to the successive comparison register 21. In response, the register 21 sequentially takes in outputs of the comparator 20 while feeding them out in the form of outputs 21S. When the switching signal AD/DA applied from the terminal 5-2 to the latch 22 with a selector is in a ONE, the latch 22 is caused into an AD operation mode for latching the outputs 21S of the register 21 and delivering them to the output terminal 4 and timing generating circuit 23 in the form of digital outputs Dout. Conversely, when the AD/DA signal is in a ZERO, the latch 22 is brought into a DA operation mode for latching digital inputs Din which appear on the input terminal 3 and feeding them to the timing generating circuit 23. Supplied with the switching signal AD/DA, clock $\phi$, synchronizing signal SY and outputs of the latch 22, the timing generating circuit 23 produces the aforementioned switching signals 23a to 23k for operating the switches 11-0 to 11-6 and 12 to 16 as well as the control signal 23L for controlling the successive comparison register 21. In the illustrative embodiment, all the structural elements shown in FIGS. 1A and 1B are densely integrated on a single semiconductor substrate.

Figure 2:
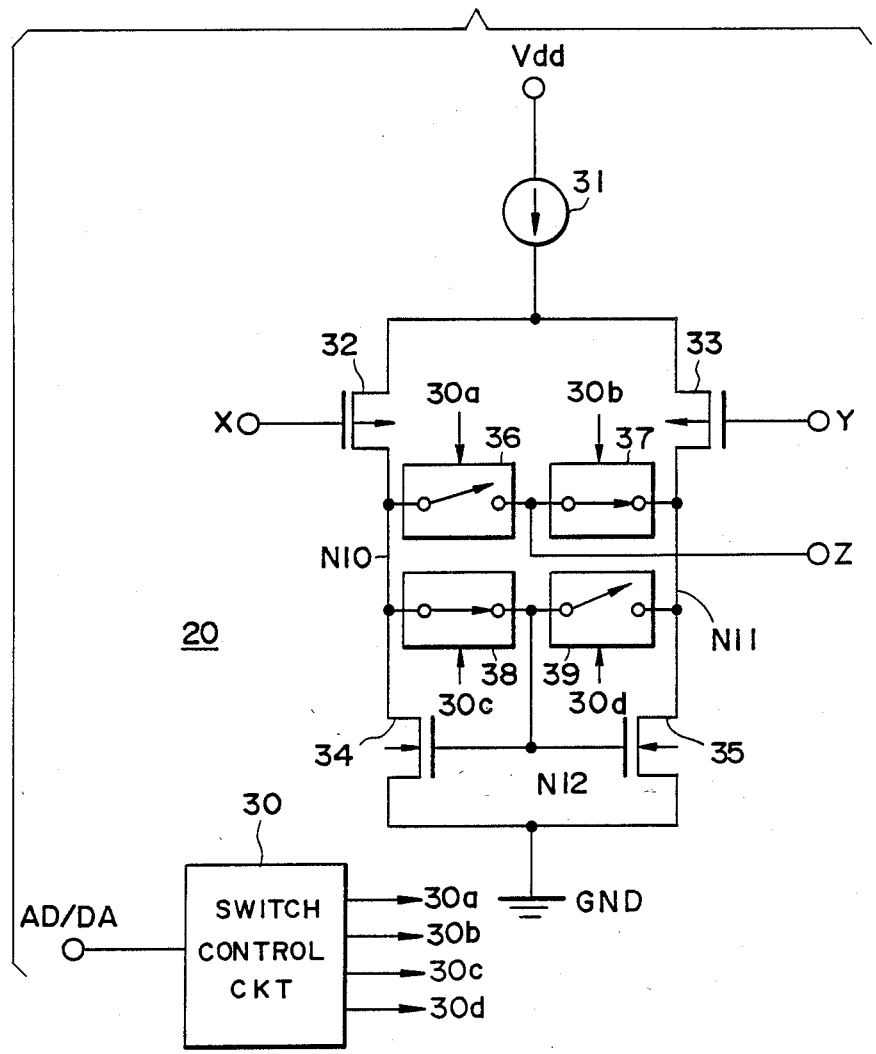
FIG. 2 is a block diagram schematically showing a specific construction of a comparator included in the converter of FIGS. 1A and 1B.

FIG. 2 shows a specific construction of the comparator 20. As shown, the comparator 20 includes a switch control circuit 30 and a constant current source 31 which is connected to a source voltage VDD. The switch control circuit 30 produces switch operating signals 30a to 30d in response to the switching signal AD/DA which is applied thereto via the AD/DA terminal. A combination of p-channel MOS transistor (PMOS) 32 and n-channel MOS (NMOS) transistor 34 and a combination of PMOS transistor 33 and NMOS transistor 35 are connected in parallel between the constant current source 31 and ground GND. The input terminals X and Y are connected to the gates of the PMOS transistors 32 and 33, respectively. A series connection of switches 36 and 37 and a series connection of switches 38 and 39 are connected between a node 10 which extends between the PMOS transistor 32 and the NMOS transistor 34 and a node 11 which extends between the PMOS transistor 33 and NMOS transistor 35. The output terminal Z is connected to between the switches 36 and 37 while the gates of the NMOS transistors 34 and 35 are connected to a node N12 which interconnects the switches 38 and 39. Applied to the switches 36 to 39 are the switching signals 30a to 30d, respectively.

In the construction shown in FIG. 2, assume that the switching signal AD/DA applied to the switch control circuit 30 is a ONE. Then, the switches 37 and 38 are respectively turned on by the switching signals 30b and 30c and the switches 36 and 39 are respectively turned off by the switching signals 30a and 30d. This causes the input terminals X and Y to function respectively as an inverting and a non-inverting input terminal with the result that a signal associated with a difference between the voltages appearing on the input terminals X and Y is delivered via the output terminal Z. On the other hand, when the switching signal AD/DA is a ZERO, the switches 36 and 39 are turned on and the switches 37 and 38 are turned off by their associated switching signals 30a to 30d. In this condition, the input terminals X and Y serve respectively as a non-inverting and an inverting input terminal to constitute a voltage follower type amplifier and, hence, the comparator 20 is operable as an impedance converter.

Figure 3A:
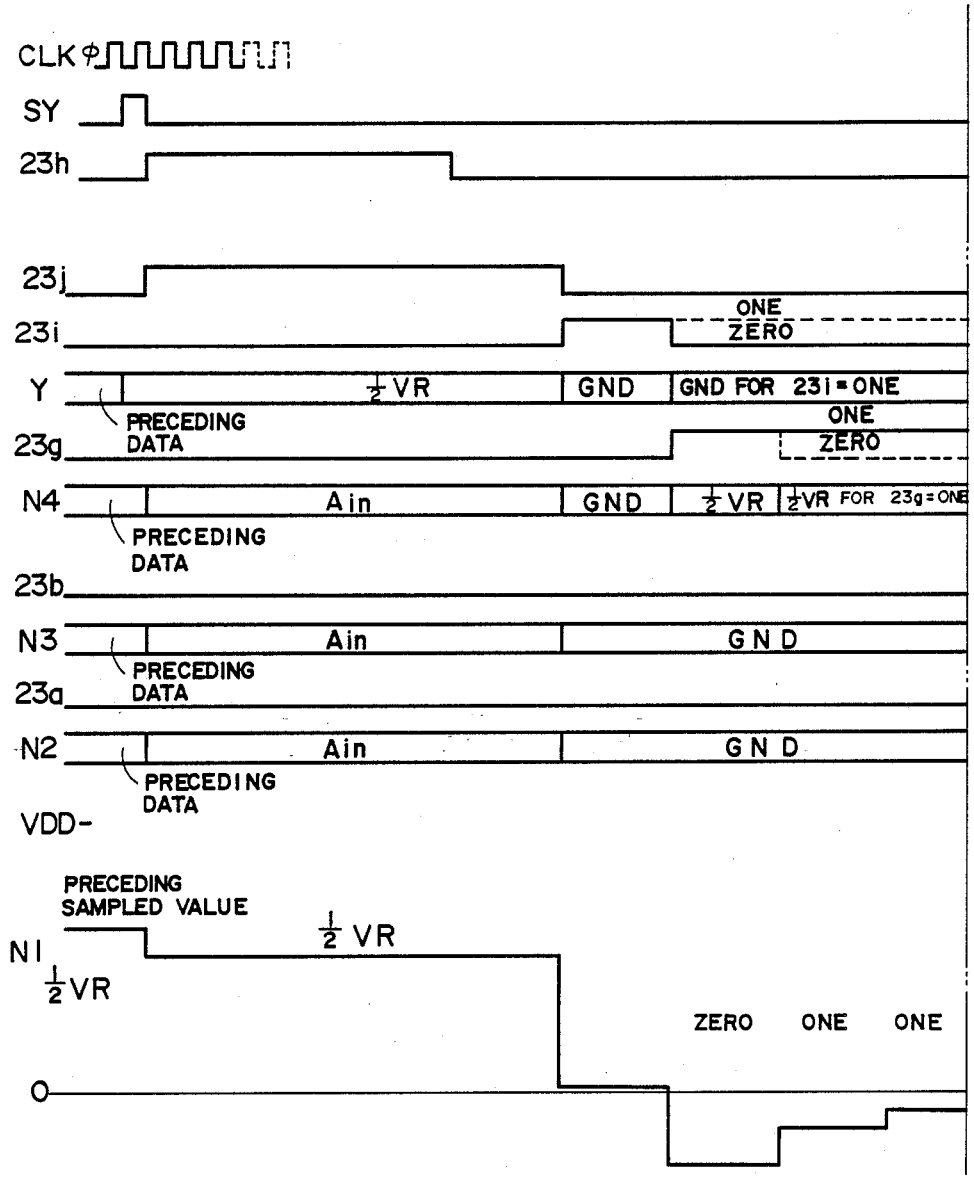
FIGS. 3A and 3B, when combined as shown in FIG. 3, are timing charts demonstrating an AD conversion mode operation of the converter shown in FIGS. 1A and 1B.
Figure 3B:
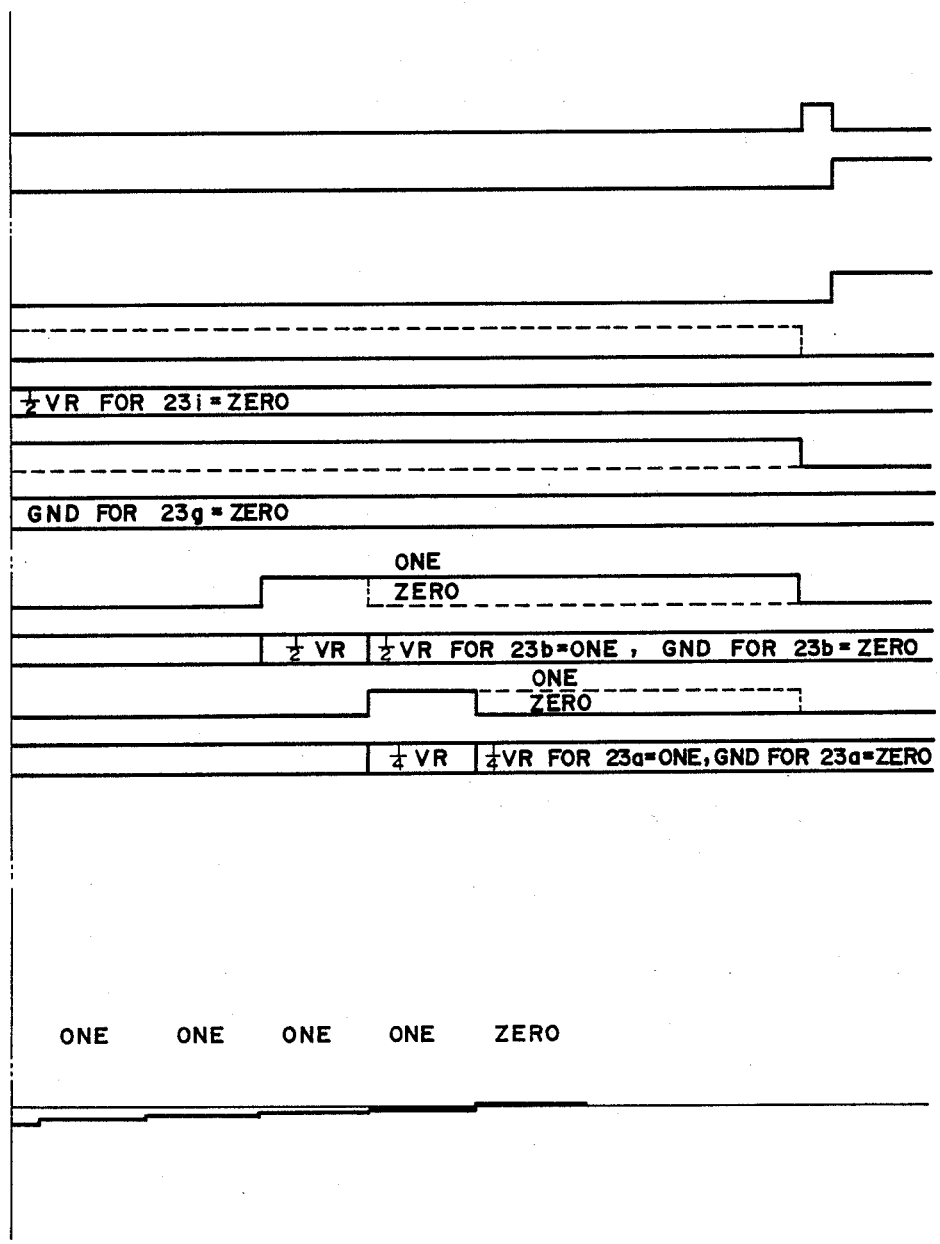
Figure 4A:
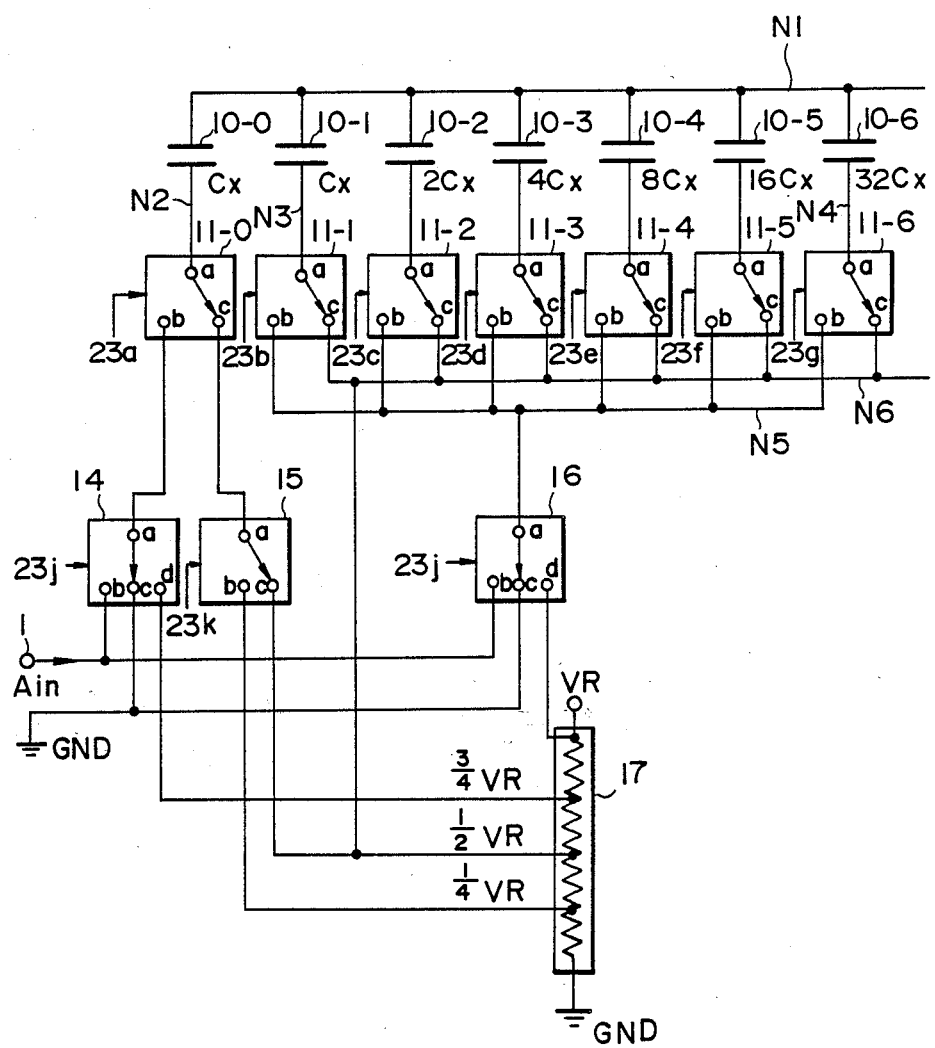
FIGS. 4A and 4B are views similar to FIGS. 1A and 1B, showing an initial condition of DA conversion mode of operation of the converter shown in FIGS. 1A and 1B.
Figure 4B:
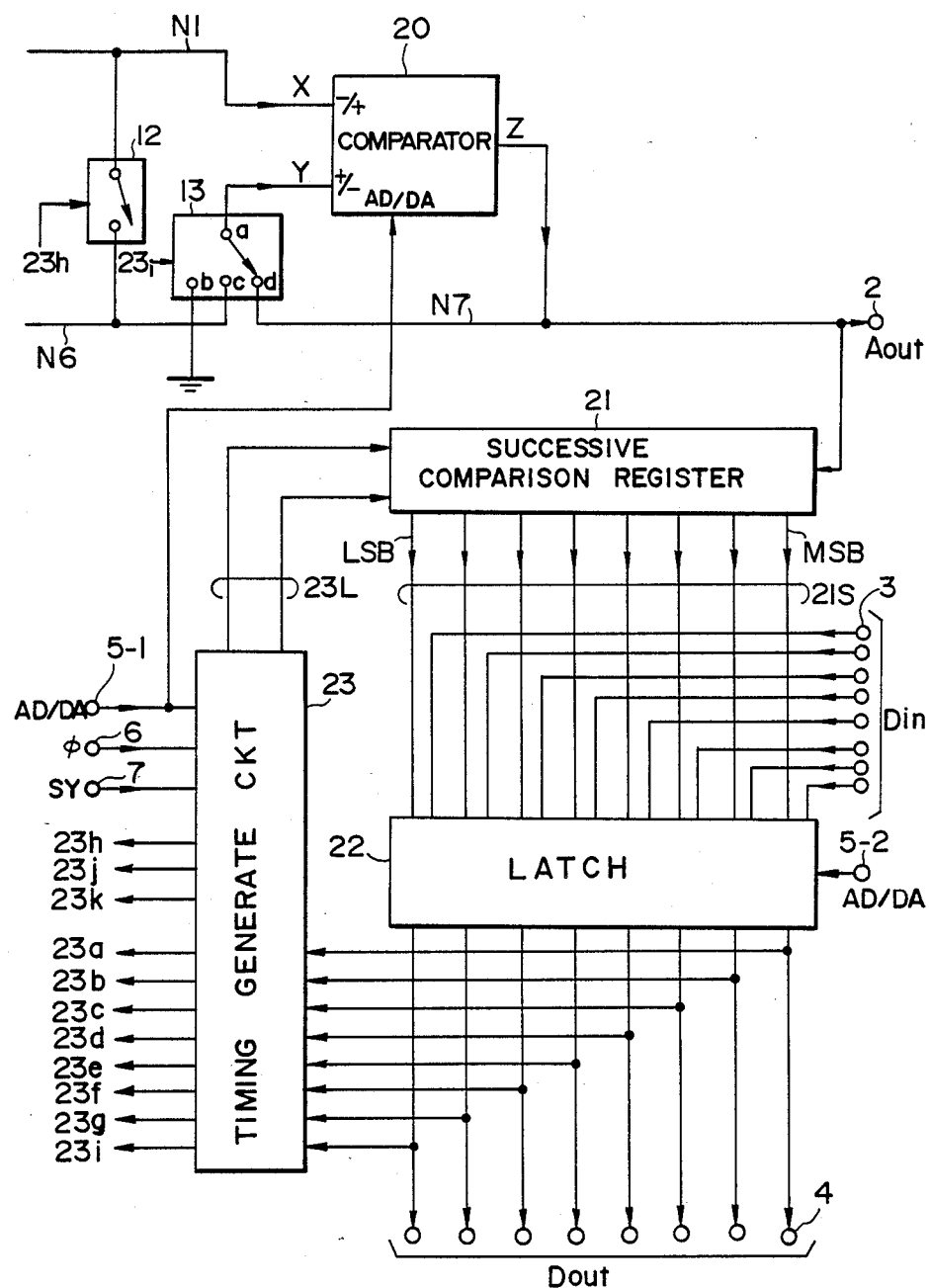
Figures 5, 5A:
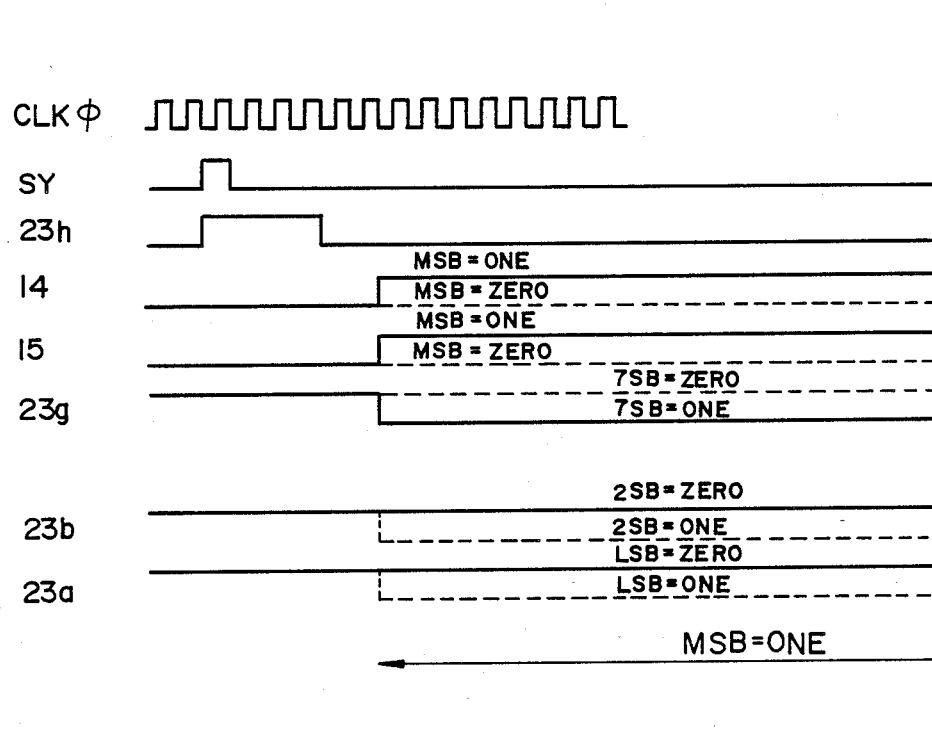
FIGS. 5A and 5B, when combined as shown in FIG. 5, are timing charts useful for understanding a DA conversion mode operation of the converter shown in FIGS. 1A and 1B.
Figure 5B:
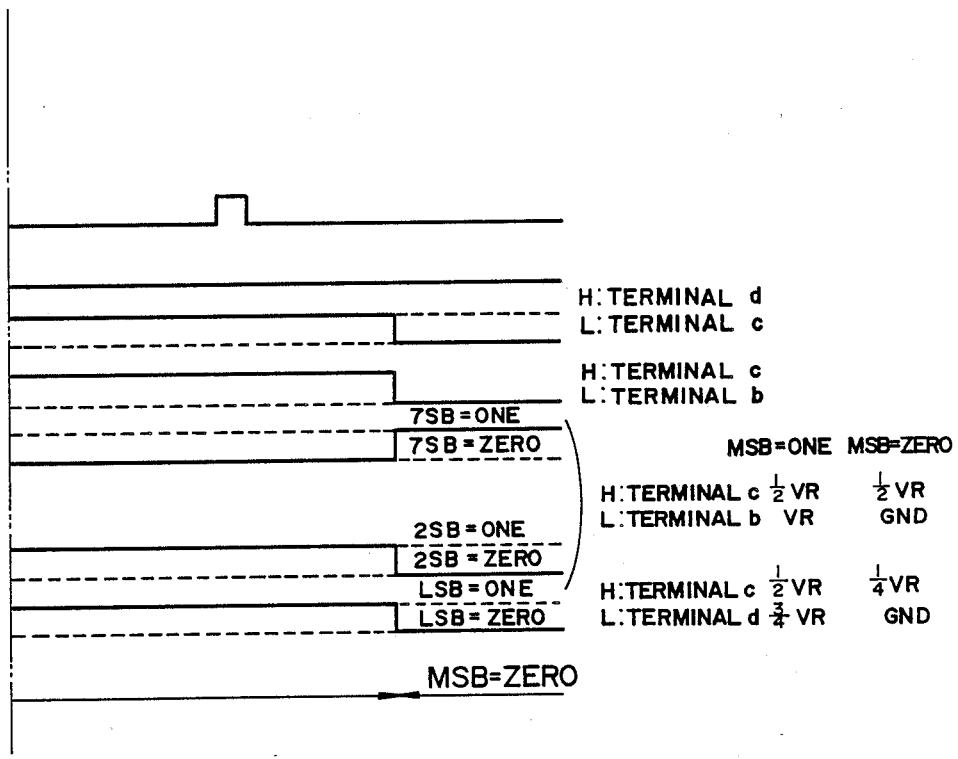

The AD mode operation and the DA mode operation of the combined AD-DA converter having the above construction will be described with reference to FIGS. 3A to 5B. FIGS. 3A and 3B are timing charts useful for understanding an AD conversion mode operation, FIGS. 4A and 4B are diagrams schematically showing an initial condition of the circuitry of FIGS. 1A and 1B which occur in a DA conversion mode, and FIGS. 5A and 5B are timing charts demonstrating a DA conversion mode operation.

1. AD CONVERSION MODE OPERATION

In FIG. 1B, as the switching signal AD/DA appearing on the terminals 5-1 and 5-2 turns from ZERO to ONE, the comparator 20 and latch 22 are individually brought into an AD conversion mode. It is to be noted that the switches 11-0 to 11-6 and 12 to 16 are shown in their initial positions of AD conversion mode in FIGS. 1A and 1B. In this condition, the voltage $\frac{1}{2}$·VR is applied to the node N1 via the switch 12, and an analog input Ain appearing on the input terminal 1 is fed to the other plate of the capacitors 10-0 to 10-6 via the associated switches 11-0 to 11-6, 14 and 16.

When the switch 12 is turned off and then the movable arms a of the switches 14 and 16 are individually connected to the associated stationary terminals c, the other plate of the capacitors 10-0 to 10-6 is connected to ground GND via the switches 11-0 to 11-6. Consequently, a voltage representative of a difference between $\frac{1}{2}$·VR and Ain, i.e., $\frac{1}{2}$·VR - Ain appears on the node N1. Simultaneously, the movable arm a of the switch 13 is connected to the stationary terminal b to in turn connect the input terminal Y of the comparator 20 to ground GND. Then, the comparator 20 is caused to sample the analog input Ain while comparing it with the GND potential and to deliver a result of comparison associated with the most significant bit (MSB) to the successive comparison register 21 via the output terminal Z.

When the result associated with MSB is in a ZERO, the successive comparison register 21 returns the movable arm a of the switch 13 into connection with the stationary terminal c by the switch operating signal 23i and via the latch 22 and timing generating circuit 23. Consequently, the input terminal Y of the comparator 20 is controlled to the voltage $\frac{1}{2}$·VR. Conversely, when the result associated with MSB is a ONE, the register 21 maintains the movable arm a of the switch 13 in connection with the stationary terminal b so that the GND potential appears on the input terminal Y. Subsequently, the register 21 connects the movable arm a of the switch 11-6 to the stationary terminal c by the switching signal 23g and via the latch 22 and timing generating circuit 23, resulting in the voltage $\frac{1}{2}$·VR being applied to the other plate of the capacitor 10-6. As a result, a voltage expressed as $\frac{1}{2}$·VR - Ain $+\frac{1}{4}$·VR appears on the node N1. At this time, a state associated with the second bit (2nd SB) is produced on the output terminal Z of the comparator 20. Thereafter, the switches 11-5, 11-4, 11-3, 11-2 and 11-1 are sequentially operated in this order in the same manner as the switch 11-6, thereby producing results of comparison associated with the third bit (3rd SB) to the seventh bit (7th SB). This is followed by connecting the movable arm a of the switch 11-0 to the stationary terminal c in the above-described manner so as to apply the voltage $\frac{1}{2}$·VR to the other plate of the capacitor 10-0. At this instant, a voltage of 1/128·VR appears on the node N1 so that a result of comparison associated with the eighth bit or least significant bit (LSB) is produced on the output terminal Z of the comparator 20. Such a sequence of operations for comparing 2nd SB to LSB is a predetermined sequence which is not effected by the value of MSB and is executed as follows.

When the clock $\phi$, synchronizing signal SY and a ONE of the switching signal AD/DA shown in FIG. 3A are applied to the timing generating circuit 23 via the terminals 6, 7 and 5-1, respectively, the timing generating circuit 23 produces the switch operating signals 23h, 23j, 23i as shown in FIGS. 3A and 3B and the control signal 23L which is the timing signal necessary for the successive comparison. As the switches 12, 14, 16 and 13 are operated by the signals 23h, 23j and 23i, the comparator 20 compares the voltage appearing on the node N1 (voltage appearing on the input terminal X of the comparator 20) as shown in FIGS. 3A and 3B and the voltage appearing on the input terminal Y of the comparator 20. In response to the control signal 23L, the successive comparison register 21 takes in the output of the comparator 20, transfers it to the latch 22 in the form of an output 21S, and returns the resulting output of the latch 22 to the timing generating circuit 23. In the same manner, the timing generating circuit 23 sequentially produces the switch operating signals 23g to 23b and 23a to actuate the switches 11-6 to 11-1 and 11-0 one after another. As a result, the voltage on the node N1 is sequentially varied in association with the voltages on the nodes N4 to N3 and N2, as shown in FIGS. 3A and 3B. The comparator 20 compares the varying voltage on the node N1 with the voltage appearing on the input terminal Y. The results of comparison are sequentially loaded in the register 21 and transferred to the output terminal 4 and timing generating circuit 23 via the latch 22. Hence, the outputs of the latch 22, i.e., digital outputs Dout associated with the analog input Ain appear on the output terminal 4.

2. DA CONVERSION MODE OPERATION

In the initial condition of DA conversion mode operation shown in FIG. 4, when the switching signal AD/DA fed to the terminals 5-1 and 5-2 turns from a ONE to a ZERO, the comparator 20 and latch 22 are individually caused into a DA operation mode. More specifically, the input terminals X and Y of the comparator 20 come to function as a non-inverting input terminal and an inverting input terminal, respectively. The movable arm a of the switch 13 is caused into connection with the associated stationary terminal d with the result that the input terminal Y of the comparator 20 is brought into connection with the output terminal 2 via the node N7. The comparator 20 therefore constitutes a voltage follower type amplifier and serves the function of an impedance converter. All the movable arms a of the switches 11-0 to 11-6 and 15 are brought into connection with their associated stationary terminals c, whereby the voltage $\frac{1}{2}$·VR is coupled to the other plate of the capacitors 10-0 to 10-6.

First, the switch 12 is turned from its OFF state to an O state to equalize the nodes N1 and N6 with respect to potential. This interconnects the opposite plates of the individual capacitors 10-0 to 10-6 and thereby causes the capacitors to discharge the charges which they have stored. Such a discharging operation, however, is executed for only the first sampling involved in DA conversion and not for the subsequent sampling. The latch 22 is connected to the input terminal 3 by a ZERO of the switching signal AD/DA so as to take in, at the sequential samplings, the digital inputs Din which are fed to the input terminal 3. The digital inputs Din held by the latch 22 are delivered to the timing generating circuit 23 in the form of digital outputs Dout. In response, the timing generating circuit 23 produces the switch operating signals 23a to 23k as well as the control signal 23L.

Assume that the data format of the digital inputs Din is straight binary and that MSB of such digial inputs Din is a ONE. Then, the switch operating signal 23j causes the movable arms a of the switches 14 and 16 into connection with their associated stationary terminals d to thereby connect them to the voltages $\frac{3}{4}$·VR and VR, respectively. The switch operating signals 23a to 23g individually control the switches 11-0 to 11-6 so as to connect the movable arm a of any of the switches 11-0 to 11-6 associated with the n-th SB (n being natural numbers of 0 to 6) of the digital inputs Din which is a ONE to the associated stationary terminal b. At this instant, the switch operating signal 23k maintains the movable contact a of the switch 15 in connection with the stationary contact c. Likewise, the switch operating signals 23a to 23g maintain the movable arm a of any of the switches 11-0 to 11-6 associated with the n-th SB which is a ZERO in connection with the stationary terminal c. By such a procedure, either the reference voltage VR or the voltage $\frac{1}{2}$·VR is applied to one plate of the capacitors 10-1 to 10-6 while either the voltage $\frac{3}{4}$·VR or the voltage $\frac{1}{2}$·VR is applied to one plate of the capacitor 10-0.

Next, assume that MSB of the digital inputs Din is a ZERO. In this case, the switch operating signal 23j holds the movable arms a of the switches 14 and 16 in connection with their associated stationary terminals c, and the switch operating signal 23k causes the movable arm a of the switch 15 into connection with stationary terminal b. Further, the switch operating signals 23a to 23g individually control the switches 11-0 to 11-6 such that, if the n-th SB of the digital inputs Din is a ONE, the movable arms a of the switches 11-0 to 11-6 are held in connection with the stationary terminals c and, if it is a ZERO, the movable arms a of the switches 11-0 to 11-6 are actuated into connection with the stationary terminals b. Consequently, the GND potential or the voltage $\frac{1}{2}$·VR is coupled to one plate of the capacitors 10-1 to 10-6, and the GND potential or the voltage $\frac{1}{4}$·VR is applied to one plate of the capacitor 10-0.

As described above, by setting the voltages appearing on the other plate of the differently weighted capacitors 10-0 to 10-6 in association with the digital inputs Din which come in through the input terminal 3, it is possible to vary the potential on the common node N1 of the capacitors 10-0 to 10-6 over a range of 0/256 times to 255/256 times the reference voltage VR. The potential on the node N1 is fed to the input terminal X of the comparator 20 and thereby subjected to impedance conversion, the output of the comparator 20 being in turn fed out in the form of an analog output Aout via the output terminal Z, node N7 and output terminal 2.

As shown in FIG. 5, the processing for DA conversion discussed above is implemented as a predetermined sequence which is unvariable with no regard to MSB of digital inputs Din, i.e. ONE or ZERO. Specifically, when the clock $\phi$ and synchronizing signal SY shown in FIG. 5 are applied to the timing generating circuit 23, the circuit 23 produces a switch operating signal 23h to turn on the switch 12. Subsequently, the timing generating circuit 23 generates switch operating signals 23j and 23k for changing the states of the switches 14 and 15 and switch operating signals 23g to 23b and 23a for changing the states of the switches 11-6 to 11-1 and 11-0. The voltages on the other terminal of the capacitors 10-0 to 10-6 vary depending upon the digital inputs Din. It follows that the analog output Aout will appear on the output terminal 2 only if the potential on the common node N shared by one plate of the capacitors 10-0 to 10-6 is subjected to impedance conversion.

An advantage achievable with the illustrative embodiment is that AD conversion and DA conversion can be selectively carried out by changing the operation mode of the comparator 20 with a polarity switching function and that of the latch 22 with a selector. More specifically, when the input polarity of the comparator 20 connected to the common node N1 of the capacitor array which is used for AD conversion is switched by the switching signal AD/DA, an analog output Aout of low impedance is achievable from a DA conversion output which appears on the common node N1 of the capacitor array. Heretofore, an AD converter and a DA Converter have been fabricated by using, for example, independent MOS integrated circuits which need substantial areas for installation. The combined AD-DA converter of the illustrative embodiment is successful in reducing the required area for installation by 60 percent or so, compared to the prior art.

In summary, it will be seen that the present invention allows AD conversion and DA conversion to be selectively effected as needed by using a comparator and a latch the operation modes of which are switchable by an external signal. This reduces the number of parts required to implement AD conversion and DA conversion and thereby remarkably cuts down the overall dimensions of an integrated circuit chip, compared to conventional AD and DA converters.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention. For example, the AD-DA converter may be provided with any desired number of bits other than eight bits shown and described. The GND voltage and voltages VR, $\frac{3}{4}$·VR, $\frac{1}{2}$·VR and $\frac{1}{4}$·VR which are used as reference voltages may be replaced with other voltages. Further, the specific construction of the comparator 20 shown in FIG. 2 is only illustrative and not restrictive.

What is claimed is:

1. An analog-to-digital and digital-to-analog converter comprising:
   a capacitor array comprising a plurality of capacitors, each of which has capacitance differently weighted from the others and has one electrode connected to a common node;
   first switch means for selectively applying, in response to a first control signal, either one of an analog input applied to an analog input terminal and a plurality of reference voltages to another electrode of said capacitors;
   comparator means provided with a pair of input terminals which are selectively operative as an inverting and a non-inverting input switchable with respect to polarity in response to a second control signal, said comparator means comparing a voltage appearing on said node and applied to one of said input terminals and one of the reference voltages applied to the other input terminal;
   an analog output terminal connected to an output of said comparator means;
   successive comparison register means for sequentially taking in outputs of said comparator means in response to a third control signal;
   a latch for selectively taking in and temporarily holding either one of digital inputs applied via a digital input terminal and outputs of said successive comparison register in response to the second control signal;
   a digital output terminal connected to an output of said latch; and
   a timing generating circuit for generating the first and third control signals in response to an output of said latch.

2. A converter in accordance with claim 1, wherein said comparator means selectively assumes a first and a second operation mode in response to the second control signal, said comparator means producing, in the first operation mode, an output associated with a difference between voltages appearing on said pair of input terminals and performing, in the second operation mode, impedance conversion between said pair of input terminals and an output of said comparator means;
   said comparator means comprising second switch means for constituting, in the second operation mode, a voltage follower type amplifier for impedance conversion in response to the first control signal.

3. A converter in accordance with claim 1, wherein said capacitors have capacitances which are individually weighted by powers of 2.

4. A converter in accordance with claim 2, further comprising a semiconductor substrate, on which integrated are said capacitor array, said first and second switch means, said comparator means, said analog and digital input terminals, said analog and digital output terminals, said successive comparison register, said latch and said timing generating circuit.

5. An analog-to-digital and digital-to analog converter comprising:
   an analog input terminal for receiving an analog input;
   a digital input terminal for receiving digital inputs;
   a plurality of capacitor means each being differently weighted in capacitance from the others by a power of 2;
   reference voltage means for generating a plurality of reference voltages;
   first switch means for selectively connecting either one of said analog input terminal and the plurality of reference voltages to one electrode of said plurality of capacitor means in response to a first control signal;
   comparator means provided with a pair of input terminals which are selectively operable as an inverting and a non-inverting input switchable with respect to polarity in response to a second control signal which selectively commands a first and a second operation mode, one of said pair of input terminals being connected to another electrode of said capacitors, said comparator means comparing voltages appearing on said pair of input terminals;
   second switch means for, in response to the first control signal, selectively connecting either one of the reference voltages to the other of said pair of input terminals and configurating said compator means into a voltage follower type amplifier for impedance conversion;
   an analog output terminal connected to an output of said comparator means;
   a successive comparison register for sequentially taking in outputs of said comparator means in response to a third control signal;
   a latch for selectively taking in and temporarily holding either one of digital inputs from said digital input terminal and outputs of said successive comparison register in response to the second control signal;
   a digital output terminal connected to an output of said latch; and
   a timing generating circuit for generating the first and third control signals in response to an output of said latch;
   in response to the second control signal, said comparator means in the first operation mode producing an output associated with a difference between voltages appearing on said pair of input terminals, and in the second operation mode performing the impedance conversion between said pair of input terminals by selecting polarity opposite to polarity assigned to the first operation mode;
   in response to the second control signal, said latch taking in outputs of said successive comparison register in the first operation mode and digital inputs from said digital input terminal in the second operation mode.

6. A converter in accordance with claim 5, wherein said timing generating circuit generates the first and third control signals in response to a predetermined clock so as to enable:

in the first operation mode, said plurality of capacitor means to be connected to said analog input terminal and the other input terminal of said comparator means to be connected to one of the reference voltages which is associated with an output of said latch, then said plurality of capacitor means to be sequentially connected to said one reference voltage one at a time, and thereafter the connection to be repeated until a digital output of a predetermined bit appears on said digital output terminal; and in the second operation mode, the other input terminal of said comparator means to be connected to the output of said comparator means and, in response to the digital inputs, said plurality of capacitor means to be connected to one of the reference voltages, and then any of said capacitor means associated with a significant bit of the digital inputs to be connected to one of the reference voltages and any of said capacitor means associated with an insignificant bit to be connected to another of the reference voltages.

7. A converter in accordance with claim 5, further comprising a semiconductor substrate, on which integrated are said analog and digital input terminals, said plurality of capacitor means, said reference voltage means, said first and second switch means, said comparator means, said analog and digital output terminals, said successive comparison register, said latch and said timing generating circuit.

* * * * *